United States Patent [19]
Courier de Mere

[11] 4,009,565
[45] Mar. 1, 1977

[54] TIME MEASURING DEVICE HAVING A PERIODIC SIGNAL GENERATOR

[75] Inventor: Henri Edouard Francois Marie Courier de Mere, Paris, France

[73] Assignee: BISOCA Societe de Recherches, Clichy, France

[22] Filed: Oct. 10, 1974

[21] Appl. No.: 513,927

[30] Foreign Application Priority Data
May 7, 1974 France ............................ 74.15738
June 19, 1974 France ............................ 74.21207
July 11, 1974 France ............................ 74.24214

[52] U.S. Cl. .............................. 58/50 R; 58/28 R; 318/126; 331/117 R; 58/23 AC
[51] Int. Cl.² ...................................... G04B 19/34
[58] Field of Search ............ 58/23 R, 23 A, 23 BA, 58/50 R, 28 R, 23 AC; 318/126; 331/167, 108 R, 108 A, 111, 112, 117 R

[56] References Cited
UNITED STATES PATENTS 2,919,416 12/1959 Jones ........................ 331/117 X
2,957,145 10/1960 Bernstein ........................ 331/112
3,443,242 5/1969 Reich ................................ 331/71
3,509,714 5/1970 Walton ............................ 58/23 R
3,528,238 9/1970 Stampfli .......................... 58/23 A
3,818,484 6/1974 Nakamura et al. ......... 58/23 BA X FOREIGN PATENTS OR APPLICATIONS
785,749 11/1957 United Kingdom ............... 331/111
801,453 9/1958 United Kingdom ........... 331/108 A Primary Examiner—Ulysses Weldon
Attorney, Agent, or Firm—Pennie & Edmonds

[57] ABSTRACT

A time measuring device and an oscillator assembly for generating a periodic signal having a predetermined frequency output is disclosed. The time measuring device may be in the form of a watch, clock or other form of timekeeping device. The oscillator assembly formed by at least one transistor in resonant circuit make-up is energized by a continuous current source.

18 Claims, 7 Drawing Figures

TIME MEASURING DEVICE HAVING A PERIODIC SIGNAL GENERATOR

BACKGROUND OF THE INVENTION

Many time measuring devices of the type including clocks, watches and other similar forms of timepiece include a quartz oscillator for signal generation and a frequency divider for purposes of making available at an output a sub-multiple of the frequency of the quartz oscillator. These generators have numerous disadvantages.

To this end, generators formed by a quartz oscillator require a relatively high input voltage, usually in excess of 1.5 volts. Such an input requirement necessitates the use of silver oxide batteries capable of supplying an electromotive force of 1.6 volts. While the silver oxide battery has an energy per unit ratio lower than that of a mercury battery, it is not possible to utilize the mercury battery in the generator circuit input because of its electromotive force supply capability. The electromotive force of a mercury battery generally is on the order of about 1.3 volts. Also, the frequency determined by a quartz varies considerably as a function of temperature (the variation of the quartz being on the order of $10^{-6}/°$ C.). Therefore, to vary the resonance frequency when the quartz cannot be produced with that precision necessary to effect temperature compensation, the oscillator circuit must comprise variable circuit components, such as resistors and capacitors. Such circuit components have an inherent stability which, to a large extent, reduces the inherent stability of the quartz thereby increasing the difficulty in compensating for variations. In addition, the quartz is bulky. Further, the oscillator utilizing a quartz generally consumes current on the order of 5 microamperes. Finally, the frequency of the quartz oscillator is dependent on the stability of the supply voltage. Since the quartz oscillator consumes a considerable amount of energy during operation, the voltage of the supply, if a battery, tends to discharge over extended use causing consequent frequency variation of the oscillator.

BRIEF SUMMARY OF THE INVENTION

The present invention is directed to a time measuring device which in the present context is considered as including clocks, watches and other similar forms of timepiece and to a powered oscillator which is capable of fulfillment of the practical requirements of prior art devices, yet one that overcomes the above-mentioned disadvantages. The time measuring device according to the present invention comprises a generator of periodic signals having a predetermined frequency and a continuous current source for supply of the generator with electrical energy. The current source may be a battery. The generator of periodic signals having a predetermined frequency may include one or more transistors in a circuit network constituting an oscillator assembly having a control frequency. As will be brought out, the time measuring device and oscillator have good frequency characteristics, are relatively simple and economical to produce, and consume reduced amounts of electrical energy during operation.

In one form of the present invention, the time measuring device is characterized by a generator including a first transistor and a second transistor in circuit arrangement with resistive and capacitive means to provide an oscillator assembly.

The resistive means preferably comprises a first variable resistor for regulating the predetermined frequency, and a second variable resistor designed to permit regulation of the length of each periodic signal supplied by the generator.

The oscillator assembly may either be a blocked oscillator or a multivibrator and is supplied power by a continuous current supply source.

In this form of the present invention the time measuring device includes an inductor or winding at the output of the oscillator assembly and supplied by the periodic signals generated therein. The winding produces a magnetic field which acts to attract or repel a magnetic element carried by a rocker or pendulum of the time measuring device. The pendulum will oscillate against a bias force when the winding is supplied by periodic signals.

In a further form of the present invention, the time measuring device is characterized by a continuous current supply source, a luminous indicating device and a generator of periodic signals formed by a resonant, highly stable inductance-capacitance circuit including at least one transistor, the circuit constituting an oscillator having a frequency several times greater than the control frequency of the indicating device.

The oscillator of this form of the invention may be supplied from a low voltage source of, for example, 0.5 volts. The source voltage may be regulated by a regulating element such as a Zener diode arranged in parallel with both the source voltage and a decoupling capacitor. The oscillator assembly possesses good stability. By precaution that each transistor have a short switching time — the capacitances of the switching function being low — high frequencies of, for example, $2^{15}$Hz may be obtained. This permits a capacitor having a low capacitance to be used in the oscillator assembly. The inductor may provide a ferrite core.

In addition, the temperature coefficients of components of this form of the invention are very low, for example, $\pm 0.5 \times 10^{-6}/°$ C. in the case of ferrites. Owing to the powerful self-inductance which may be employed, the signal level is high. If the switching time of the invention is sufficiently short, the current is strictly sinusoidal.

A time measuring device of the present invention may control an optoelectric indicating system, such as one employing liquid crystals which may require a separate supply source of, for example, 1 $\mu$ amp at 4 volts. A frequency divider may be provided for purposes of reducing the frequency, for example, from $2^{+15}$Hz to 1 Hz.

In a variant of this form of the present invention, the continuous voltage supply source of the indicating device is obtained by rectifying a voltage removed at the inductance having a high overvoltage coefficient. A high overvoltage coefficient of this kind may be obtained, in particular, by using as this inductance a winding wound on a ferrite core which makes it possible to obtain a supply voltage for the indicating device of 7 or more volts from approximately a 1.3 volt voltage source.

In accordance with a feature of the present invention, the oscillator assembly may comprise a single transistor in circuit arrangement wherein a first winding is connected in the collector circuit and a second winding coupled to the first winding through the intermediary of a ferrite core is connected in the base circuit. The windings constitute a reaction circuit and, owing to the ferrite core, an overvoltage is obtained at its terminals, enabling the indicating device, consisting of, for example, a liquid crystal modulus comprising seven segments to be supplied with power.

Figure 1:
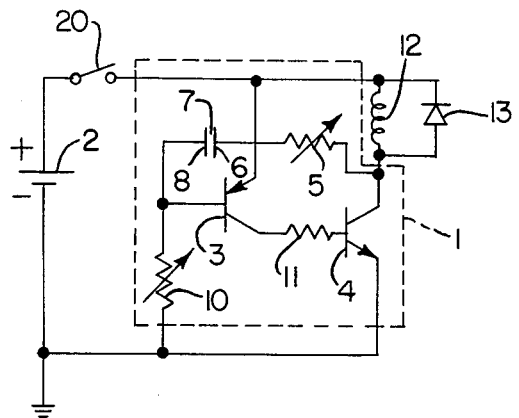
FIG. 1 is a schematic illustration of a generator of a time measuring device according to one form of the invention.
Figure 2:
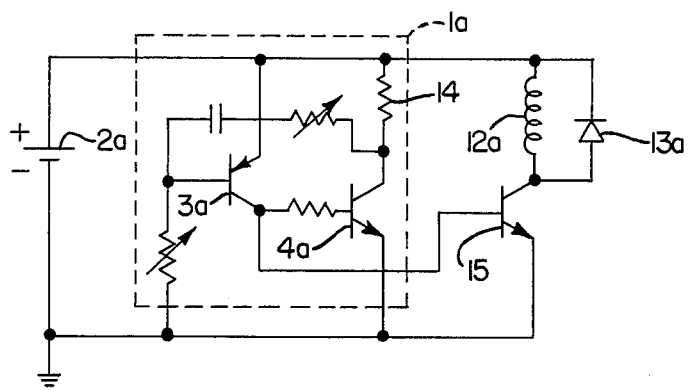
FIG. 2 is a schematic illustration of a variant of the generator shown in FIG. 1.
Figure 3:
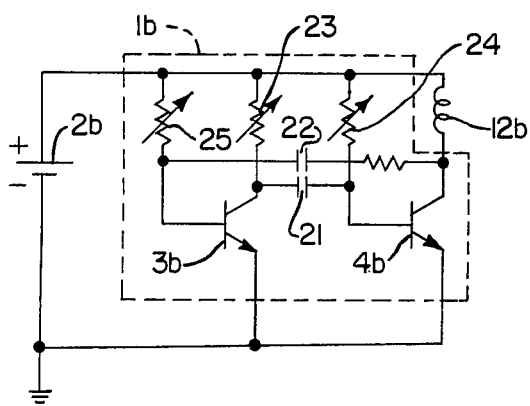
FIG. 3 is a schematic illustration of a further variant in FIG. 1.

A first form of the invention may be seen to best advantage in FIGS. 1–4. This form of the invention is directed to an oscillator assembly for generation of periodic signals of the time measuring device which are in the form of a square or rectangular waves and whose output is across an inductor. As illustrated in the Figures, the oscillator assemblies 1, 1a and 1b are supplied by a power source represented by batteries 2, 2a and 2b, respectively. Each of the oscillator assemblies include a pair of transistors in a resistance — capacitance network to be described. The oscillator assembly of FIGS. 1 and 2 is a blocked oscillator; whereas the oscillator assembly of FIG. 3 is a multivibrator.

In FIG. 1, the transistor 3 is a PNP type transistor and the transistor 4 is an NPN type transistor. The emitter of the transistor 3 is connected to the positive pole of a battery 2 through a switch 20. The collector of the transistor 4 is connected to the base of transistor 3 through a variable resistor 5 and a capacitor 7. The plates of the capacitor are denoted by the numerals 6 and 8. The base transistor 3 is also connected to the ground through a second variable resistor 10. The negative terminal of the battery 2 and the emitter of the transistor 4 are grounded, also. In the form of the invention of FIGS. 1–3 the battery may be a mercury battery capable of supplying power at 1.35 V.

The collector of the transistor 3 is connected to the base of the transistor 4 through a resistor 11.

The collector of the transistor 4 is connected to the positive pole of the battery 2 through the winding 12. The winding 12 is outside of the oscillator itself and forms a part of the load circuit of the signals supplied by the oscillator. The role of this winding 12 will be explained in further detail hereinafter in reference to FIG. 4.

A diode 13 is arranged in parallel with the winding 12 such that its cathode is connected to the positive pole of the battery 2.

As far as the values of the various resistors in the oscillating assembly shown in FIG. 1 are concerned, it should be noted that the resistors 5 and 11 have a lower value than the resistor 10. Although not to be limiting in any sense, in a preferred embodiment, the resistor 5 is adjusted to the value 100 KΩ, the resistor 10 is regulated to the value 3.3 MΩ and the resistor 11 to the value 10 KΩ. The capacitor 7 has a capacitance of 6.800 picofarads.

As will be noted hereinafter, the capacitor 7 and the resistor 10 essentially determine the frequency (about 64 Hz in the example) of the oscillator 1. Thus, it is particularly advantageous to select this resistor 10 and the capacitor 7 in such a way that their relative variations as a function of the temperature exactly compensate each other. It is preferable to use a resistor 10 of which the relative variation coefficient $\alpha$ as a function of the temperature is negative, the relation variation coefficient $\beta$ of the capacitance of the capacitor 7 as a function of the temperature then being positive. In the above embodiment, the capacitor 7 may be a metallized polycarbonate type capacitor and the resistor 10 may be in the form of a thin metal layer on a support. In the case of the above embodiment, the coefficient $\alpha$ has the value $-50 \times 10^{-6}/°$ C. and the coefficient $\beta$ the value $+50 \times 10^{-6}/°$ C.

To ensure that the frequency of the oscillator 1 is stable as a function of the temperature, the capacitor 7 and the resistor 10 will always be housed in the same casing (not shown).

In the preferred embodiment of the invention, the oscillator 1 is in the form of a hybrid circuit and the active elements of the capacitor 7 and the resistor 10 are thus in the same casing. In the latter case, the resistor 10 will be divided into two parts. The first part will be located in the casing (not shown) and the second part — having a much lower value than the first part — will be disposed outside the casing and will be a variable value.

The operation of the blocked oscillator 1 may be appreciated from the above, but brief reference will be made thereto. When the switch 20 is closed, the load circuit to the capacitor 7 will also be closed. The load circuit comprises, in addition to the battery 2 and the capacitor 7 itself, the winding 12, the resistor 5 and the resistor 10. Thus, the potential of the base of the transistor 3 becomes negative and consequently this transistor passes into the conducting state and the same applies to the transistor 4, the base of this transistor 4 then being connected to the positive pole of the battery 2 through the intermediary of the emitter — collector resistance of the transistor 3 and the resistor 11. Thus an electric current circulates across the winding 12. At the same time, the capacitor is discharged. The discharged circuit of this capacitor 7 comprises, beginning with the plate 6, the resistor 5, the winding 12 and the emitter reistance constituting the base of the transistor 3. When the capacitor 7 has discharged, the base of the transistor 3 is in a no load state and this returns to the blocked state. The same then applies to the transistor 4. The process can then begin again.

The diode 13 provides a short circuit path for those harmful overvoltages at the terminals of the winding 12.

It will be noted that the resistor 10 and the capacitor 7 determine the period of the oscillator 1. In addition, the resistor 5 accounts for a large fraction of the resistance of the discharge circuit of the capacitor 7. Thus, by varying the resistor 5, it is possible to vary the size of the pulses supplied by the oscillator 1. This latter arrangement (variation of the size of the pulses) is particularly important to the construction of pendulum clocks, as will be noted hereinafter.

FIG. 2 illustrates a variant of a generator of the time measuring device according to the invention. The oscillator 1a which forms the generator is substantially identical to oscillator 1 described above. In this variant the winding 12 is replaced by a resistor 14 having a low value (50 KΩ). The winding 12a of the device shown in FIG. 2 is inserted in the collector circuit of a supplementary transistor 15 of an NPN type.

The base of the transistor 15 is connected to the collector of the transistor 3a and the emitter of transistor 15 is grounded. The winding 12a is also connected to the positive pole of the battery 2a. In the manner and for the purposes of FIG. 1, the winding 12a is short circuited by a diode 13a.

The signals obtained at the terminals of the winding 12a have been found to be "purer" than those signals obtained across winding 12 of oscillator 1. Indeed, the winding 12a is thus separated from the oscillator assembly itself and cannot have any influence on the frequency of this device.

The oscillator 1b shown in FIG. 3 comprises two transistors 3b and 4b having the same type of conductivity — in this case NPN — which are arranged in the form of multivibrator. The capacitors 21 and 22 (value 47pF each) which connect, respectively, the collector of the transistor 3b to the base of the transistor 4b and the collector of the transistor 4b to the base of the transistor 3b, determine with the variable resistor 23 (maximum value 47 KΩ) the frequency of the signals produced by this multivibrator. The resistor 23 is inserted between the collector of the transistor 3b and the positive terminal of the battery 2b. The resistors 24 and 25 (each of maximum value 470 KΩ) which are also variable determine the size of the pulses produced by the multivibrator. The resistor 24 is inserted between the base of the transistor 4b and the positive terminal of the battery. Likewise, the resistor 25 is disposed between the base of the transistor 3b and the positive terminal of the battery 2b. In this embodiment, the winding 12b (impedance 47 KΩ) is inserted between the collector of the transistor 4b and the positive terminal of the battery. The operation of the device represented in FIG. 3 should be apparent.

Figure 4:
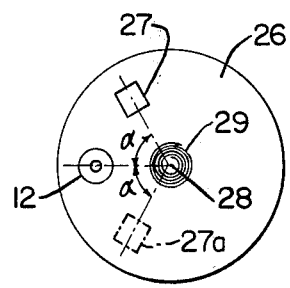
FIG. 4 is a diagrammatic view of an indicating device including a rocker or pendulum and a winding of an indicator according to the form of FIG. 1.

The operation of a clock having a rocker or pendulum 26, the oscillation of which is controlled by the pulses provided by the oscillator 1, 1a to 1b, will now be described in reference to FIG. 4. Operation will be described assuming that the assembly shown in FIG. 1 will supply the winding 12, represented in FIG. 4.

The pendulum 26 is in the form of a flat disc. A magnet 27 is carried on one face. The magnet 27 is located adjacent to the periphery of the disc 26. The magnet 27 may be a simple piece of ferrite. The axis 28 of the pendulum is integral with a biasing or recall spring 29. The winding 12 is inserted in such a way that its axis is parallel to the axis 28 of the pendulum 26. In addition, the axis of the winding 12 is located at substantially the same distance from the axis 28 as the center of mass of magnet 27 and on the same side of the disc. This winding 12 is retained out of contact with the disc 26.

In the rest position the winding and the magnet 27 are separated by a given angle $\alpha$ with respect to the axis 28. When a current pulse is supplied to the terminals of the winding 12, this pulse produces a magnetic field pulse which attracts the magnet 27 to the winding 12 and thus rotates the disc 26 against the force of spring 29. At the end of the stroke, the magnet 27 is located in the position 27a represented by the perforated lines in FIG. 4. In this end position the magnet 27 forms the same angle $\alpha$ with the winding 12 with respect to the axis 28. At the end of the stroke, the spring 29 is extended and thus enables the magnet 27 to be returned to its initial position (represented by the solid lines in FIG. 4). With a suitable choice of the inertia of the pendulum 26, the frequency of the oscillator 1 and the size of the pulses provided by this oscillator, it is in this initial position that the oscillator 1 again supplies a pulse.

It will be noted that the value of the resistor 5 is regulated in such a way that the pulses provided by the oscillator 1 are as narrow as possible. Thus, the electrical energy to be supplied by the battery will be very low. In actual fact, the battery 2 is only acted on when a pulse is supplied by the oscillator 1 and between the pulses the transistors 3 and 4 are blocked so that the battery no longer supplies energy. A minimum value is selected for the size or length of the impulses. This minimum value is such that if it is slightly lower (than this minimum value), the energy supplied by the pulse would be too low for the pendulum 26 to oscillate.

To obtain this type of regulation, the resistor 5 is provided with a high value so that oscillation of the pendulum 26 can start (a large amount of energy is supplied initially) and then the value of this resistor 5 is reduced to the minimum value just before de-energization.

In the second form of the invention, the time measuring device includes an oscillator 40 capable of generating a sinusoidal signal output at a given frequency for energizing an indicating device 41. A dividing and coding device 42, for purposes as discussed and as otherwise well known, is interposed between the output and the indicating device. The indicating device comprises, for example, a liquid crystal device. The indicating device is connected directly to its own supply source 43 (for example, a 1 $\mu$ amp, 3 effective volt source).

A source 44 such as a battery serves as a power supply for oscillator 40. The oscillator 40 comprises a PNP type silicon transistor 45. The base of transistor 45 is connected to the ground through a polarizing resistor 46, the emitter of the transistor is connected to the positive bus 47 and the collector is connected directly to the base of a silicon transistor 48. The transistor 48 is complementary to the transistor 45 (thus, an NPN type transistor). Both the transistor 45 and the transistor 48 are shown in the form of a two pole transistor. These transistors preferably have a short switching time which serves to keep the output signals sinusoidal and with equally high frequencies. The transistors may be 2N 2894 and 2N 2222 transistors, for example. A field effect MOS transistors may also be used.

The emitter of transistor 48 is connected to ground. The collector of transistor 48 is connected to the positive bus 47 through a winding 49 which together with variable capacitor 50 forms an oscillating circuit for determining the frequency of the oscillator 40.

The capacitor 50 may be a ceramic capacitor. A capacitor of this type has great stability and a relative variation in time which may be less than $10^{-5}$ for one year. The winding 49 may be formed of a ferrite core (not shown). The winding should have a temperature coefficient which is very low so as not to exceed $\pm 10^{-6}/°$ C. An winding of this type may have a very high inductance reaching or exceeding 100 millihenrys while at the same time having a low volume. Consequently, with a capacitor 50 having a low capacitance, not exceeding 100 picofarads, and which can thus consist of a ceramic dielectric, preferably silicon dioxide, it is possible to obtain a frequency of, for example, $2^{15}$Hz, which is several times greater than that of the indicating frequency. In addition, owing to the high value of inductance of the winding 49, the output signal of the oscillator may be very high and reach a number of microamperes.

The resonance frequency of the oscillator is determined not only by the value of the inductance of winding 49 and the capacitance of the capacitor 50, but also by the capacitance of the collector of the transistor 48 and by the inherent capacitance of the winding 49.

In the preferred embodiment of the invention, the capacitance of the capacitor 50 is low compared to the value of the capacitance at the junctions of the transistors 45 and 48 and, advantageously, compared to the inherent capacitance of the winding 49. These various capacitances are very stable as a function of the temperature and the voltage. This is especially the case when the transistors 45 and 48 are of the silicon type and their winding 49 is a ferrite core winding. As a result, the frequency of the oscillator provides excellent stability.

The core of the winding 49 is a ferrite without hysteresis, such as one sold under the tradename "Ferrinox T6", by Cofelec Company. This ferrite has a "displacement" coefficient $$\frac{\Delta L}{L}$$

corresponding to $10^{+6}$, where L is the value of inductance.

As far as this winding 49 is concerned, it is possible in a variant to provide means for displacing the winding with respect to the core and thus to vary its value so as to modify the frequency of the oscillator 40.

A variable resistor 54 is connected between the base of the transistor 48 and ground. The resistor 54 serves to vary the frequency of oscillator 40 and, also, has the advantage of permitting rapid blocking of the transistor 48. A variable capacitor connected in parallel with the winding 49 could also be employed for purposes of varying the frequency of the oscillator 40.

Figure 5:
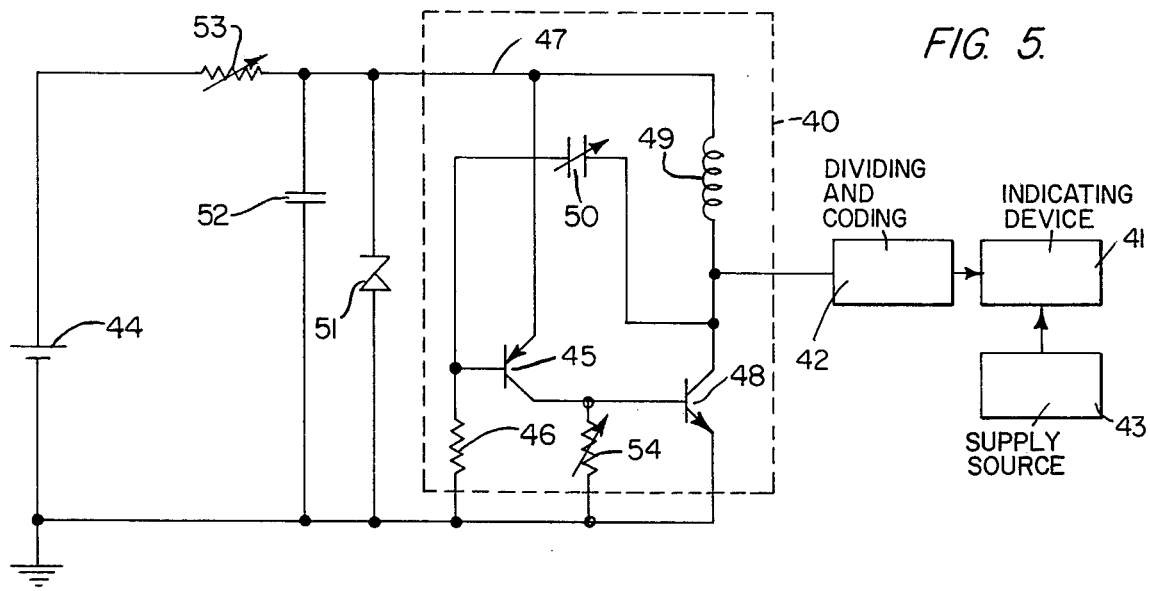
FIG. 5 is a schematic illustration of a second form of a generator of a time measuring device.

The battery 44 providing a continuous current supply source may be a 1.35 V mercury battery. The electric power consumed is very low and may drop to 2 microwatts during operation. The operating voltage of the oscillator of FIG. 5 is determined by a Zener diode 51 having a triggering voltage of, for example, 0.6 V. A ceramic capacitor 52 having a value of some tens of monofarads is connected in parallel with the diode. A variable resistor 53 serves to limit the current supplied by the battery 44. Resistor 53 may have a value of several hundreds of kilohms.

It is important to note that the minimum voltage $V_{BE}$ between the emitter and the base of transistor 45 may be greater than the voltage supplied by the source (that is, greater than the voltage supplied by the Zener diode 51) to cause it to pass from the blocked state to that of saturation. In the embodiment represented, the Zener diode supplies a voltage of 0.6 V while the voltage $V_{BE}$ of the transistor 45 is on the order of 0.8 V. The winding 49 has a sufficiently high overvoltage coefficient and a sufficiently high value to enable a considerable potential difference to be supplied between the emitter and the base of the transistor 45.

It has been found that an oscillator having a ferrite core winding had a frequency stability which surpassed that of a quartz oscillator. The relative frequency stability as a function of vibrations was found to be on the order of $\pm 0.6 \times 10^{-6}$/ week and as a function of wear this stability is on the order of $0.2 \times 10^{-6}$/week; whereas these coefficients were found to be $\pm 5 \times 10^{-6}$/week and $0.5 \times 10^{-6}$/week, respectively, when typical quartz crystals were used. No observable difference regarding resistance to shocks was noted.

Figure 6:
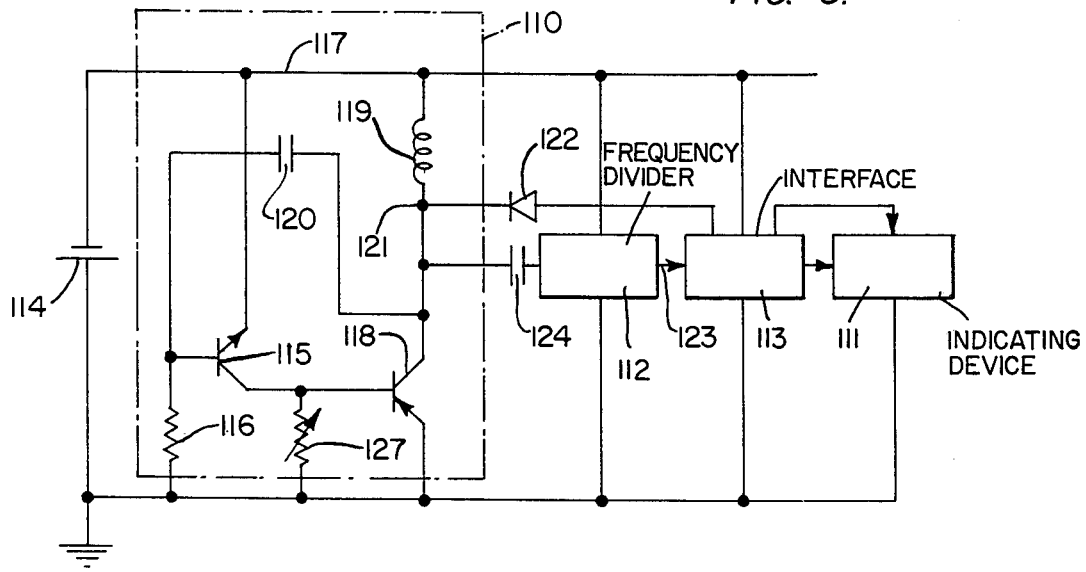
FIG. 6 is a schematic illustration of a variant of the generator shown in FIG. 5.

The device shown in FIG. 6 comprises an oscillator 110 which supplies through a capacitor 124 at the output a single alternance signal at a given frequency to an indicating device 111. A frequency divider 112 and in interface 113 is connected between the indicating device and the output, for purposes as discussed. The indicating device may be a liquid crystal device comprising seven segments.

The oscillator 110 is supplied by a source 114, such as a battery. The oscillator 110 comprises an NPN type silicon transistor 115. The base of transistor 115 is connected to the ground through a polarizing resistor 116, the emitter of transistor 115 is connected to the negative bus 117 and the collector is connected to the base of a second silicon transistor 118. Transistor 118 is complementary to transistor 115 (hence a PNP type transistor). As in the case of the transistor 115, the transistor 118 is represented in the form of a two pole transistor. A field effect MOS transistor may also be used.

The emitter of transistor 118 is connected to the ground. Collector of transistor 118 is connected to the negative bus 117 through an winding 119. Winding 119 forms a part of an oscillating circuit which determines the frequency of the oscillator 110, to be described. The base of the transistor 118 receives the output signal at the collector of the transistor 115. A variable resistor 127 connected between the base of transistor 118 and ground serves to determine the desaturation time and thus the frequency of the oscillator 110.

The capacitor 120 which may be a ceramic reaction capacitor is connected between the collector of transistor 118 and the base of transistor 115. Capacitor 120 may have capacitance value not to exceed 100 picofarads. The winding 119 is of the ferrite core type whose temperature coefficient is very low, not to exceed $\pm 10^{-6}$/° C. An inductor of this type may have a very high inductance which may reach and exceed 100 millihenrys while having a low volume. The capacitor may consist of a ceramic dielectric, preferably silicon dioxide. A frequency several times greater than that of the indicating device ($2^{15}$Hz, for example) can be obtained. In addition, owing to the high value of inductance of the winding 119, the output signal of the oscillator may be raised and may reach a number of microamperes. As was discussed in connection with FIG. 5 and for the purposes described the switching time of the transistors should be short. Transistors, such as type 2 N 2894 and 2 N 2222 may be used.

The core of the winding 119 consists, for example, of a ferrite as described above having a "displacement" coefficient $$\frac{\Delta L}{L}$$

which is lower than $10^{-6}$ and a total time loss coefficient of about $3 \times 10^{-6}$ at 25° C for 5 years.

The battery 114 providing a continuous current supply may be a 1.35 volt mercury battery. The electric power consumed by the oscillator is, above all, a function of the consumption of the indicating device.

The device of FIG. 6 is comparable to the device described in connection with FIG. 5. By using as an inductance a winding on a ferrite core, the overvoltage coefficient may be such that a peak voltage is obtained at 121 which largely exceeds 7 volts. This voltage is removed through the intermediary of a rectifying diode 122 and is applied to the decoder 113 constituting an interface between the frequency divider 112 which reduces the frequency, for example, 1 Hz at the output 123. The indicating device 111 may be a liquid crystal indicating modulus comprising seven segments. The decoder applies the rectified operating voltage from the diode 122 at the appropriate segment. The frequency divider itself may be supplied directly by the battery 114.

By using a winding 119 having an inductance on the order of 50 millihenrys and a capacitor 120 having a capacitance of 2.2 picofarads, which is sufficient to ensure blocking of the transistor 115, an overvoltage can be obtained without difficulty at point 121. This overvoltage makes it possible to supply an interface and a conventional liquid crystal indicating modulus such as those manufactured by Solid State Scientific, Inc., under the respective reference SCL 54–24F and SCL 54–40. The frequency divider can then consist of the adapted modulus (unit) which is sold under the reference SCL 54–25AF. The output of oscillator 110 to the frequency divider 112 is impressed across a capacitor 124, having a value of 10 picofarads. The components not specifically referred to may be considered equivalent to the values of like components in FIG. 5.

Figure 7:
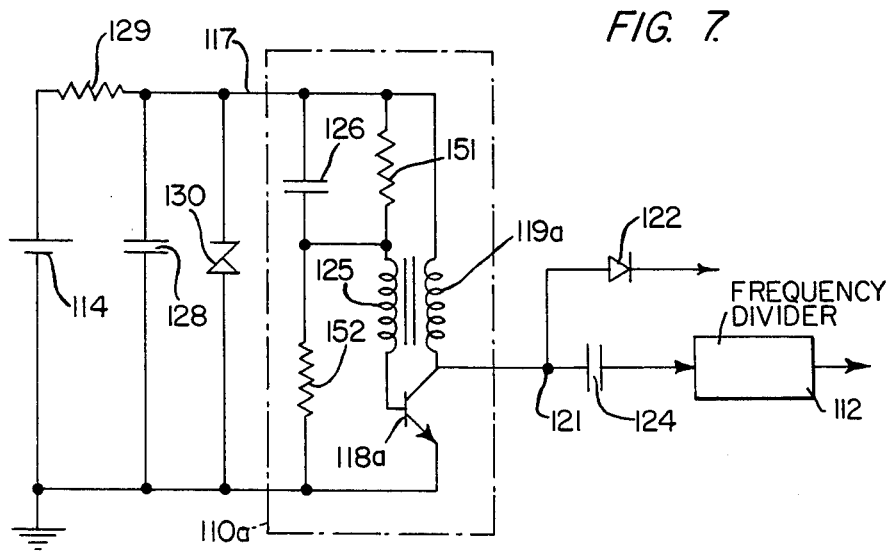
FIG. 7 is a schematic illustration of a further variant of the generator shown in FIG. 5.

FIG. 7 illustrates an oscillator 110a which is a variant of the oscillator of FIG. 6 and includes a single transistor 118a. The collector of the transistor is connected to the positive bus 117 through a winding 119a which is wound on a ferrite core. The core connects the winding of winding 119a to the winding of winding 125 located in the base circuit of transistor 118a. The windings 119a and 125 are oppositely wound so as to constitute a reaction circuit capable of initiating oscillation at a frequency determined by the features of this circuit and the value of a capacitor 126. By using windings on ferrite, the overvoltage coefficient is sufficiently high to enable the feed voltage of the decoder and the indicating modulus comprising liquid crystals (not represented) to be removed at point 121.

FIG. 7 illustrates a voltage stabilizing device similar to that discussed in connection with FIG. 5 and comprises a Zener diode 130 and a disconnecting capacitor 128 in parallel across the continuous current supply source 114. A resistor 129 limits the current supplied by the battery. In numerous cases it is possible to dispense with the Zener diode, the presence of which obviously produces a voltage drop with respect to the electromotive force of the battery 114.

Although a time measuring device consisting of a pendulum type clock with a winding exciting the movement of the pendulum has been described in reference to FIGS. 1–4, it is obvious that the invention is capable of applications other than as described. In particular, the oscillator 1, 1a or 1b could be used to produce a wrist watch comprising an oscillating lever. Wrist watches of this type could also be produced by using the pulses supplied by the generator directly to control indication of the time. The time is displayed, for example, by means of electroluminescent diodes or liquid crystals. To control this presentation operation, it is possible to use electronic or electro-magnetic counters or accumulators (not shown) to permit indication of the minutes, hours, etc.

This generator can also supply a vibrator or a step-by-step motor.

As far as concerns the variants (not shown) of the time measuring device according to the invention, it will firstly be noted that, in the case of the oscillating assembly shown in FIG. 1, the transistor 3 can be replaced by a field effect transistor (in this embodiment — with an N type channel). In this case, the capacitance of the capacitor 7 is low. In addition, the capacitor may possess smaller dimensions. By way of example, the capacitor may have a capacitance of 4700 pF and a $\beta$ coefficient of $30 \times 10^{-6}/°$ C. The resistor 10 may be a metallic film type resistor.

In regard to variants of the invention, it is necessary to point out that it is possible to use the arrangements shown in FIG. 2 (supplementary transistor 15) with the assembly shown in FIG. 3. In addition, in the case of FIG. 3, when it constitutes a variant, the emitters of the transistors 3b and 4b can be connected to the ground through a resistor (not shown).

This being the case, regardless of the embodiment used to construct the time measuring device according to the invention, it still has numerous advantages. In particular, the fact that it is not necessary to use a quartz crystal oscillator makes it possible to produce this device particularly economically. In addition, as has already been mentioned, the amount of electrical energy consumed by this device is considerably reduced. Finally, the choice of a resistor 10 and a capacitor 7 of which the relative variation coefficients as a function of the temperature are equal in absolute value but of opposite signs, makes it possible to produce time measuring devices which are very stable during operation. In one case, a time measuring device has been produced where the variation was less than 1 second per day.

In a particular embodiment the various elements are as follows:

| For FIG. 5 | |
|---|---|
| Zener diode 51 | 0,6 v type |
| Adjustable resistor 53 | 500 kΩ maximum value |
| Capacitor 52 | 22 nF |
| Resistor 46 | 2,2 MΩ |
| Capacitor 50 | 1,5 pF |
| Inductance 49 | 100 mH |
| Transistor 45 | BC 205 A |
| Transistor 48 | BC 208 A |

| For FIG. 6 | |
|---|---|
| Same values for the elements of oscillator 110 than for the corresponding elements of oscillator 40. | |
| Transistor 115 | BC 208 A |
| Transistor 118 | BC 205 A |
| Diode 122 | 1N 4148 |
| Capacitor 124 | 10 pF |

For FIG. 7

| | |
|---|---|
| Resistor 129 | 50 kΩ |
| Capacitor 128 | 22 nF |
| Zener diode 130 | 1 Volt |
| Low voltage, ceramic capacitor 126 | 22 nF |
| Resistors 151 and 152 | 50 kΩ (total value) |

| | |
|---|---|
| these resistors may be formed as a single potentiometer. | |
| Diode 122 | 1N 4148 |
| Capacitor 124 | 10 pF |

It is obvious and apparent from the above description that the invention is not limited to the embodiments and applications which have been described but other variants are possible without departing from the scope of the invention.

Having described the invention, what is claimed is:

1. A time measuring device comprising a continuous current source; an indicating device; oscillator means in circuit connection to be energized by said continuous current source and comprising at least one transistor, an inductance having a high overvoltage coefficient, and capacitive means including the inherent capacitance of said inductance connected in a resonant circuit to provide an oscillator assembly having a frequency several orders of magnitude greater than the control frequency of said indicating device, said frequency being determined by the values of said inductance and capacitive means, first means connected to said oscillator assembly for coupling the output to said indicating device, and second means connected directly to a terminal of said inductance and adapted to supply voltage for said indicating device.

2. The time measuring device according to claim 1 wherein said oscillator means comprises first and second transistors.

3. The time measuring device according to claim 2 wherein said first and second transistors are silicon transistors, said inductance in said resonant circuit being included in the emitter-collector circuit of said first transistor, and said capacitive means including a highly stable capacitor coupling the collector of said first transistor to the base of said second transistor, the dielectric of said coupling capacitor being of silica.

4. The time measuring device according to claim 3 characterized in that the capacitance of said capacitor is substantially less than the capacitances of the junctions of said first and second transistors, said resonant circuit being in part constituted by said inductive means and the junction capacitances of said first and second transistors.

5. The time measuring device according to claim 1 wherein said inductance includes an inductor wound on a ferrite core.

6. The time measuring device according to claim 5 which comprises means for displacing said inductor with respect to said core so as to vary said oscillator frequency.

7. The time measuring device according to claim 1 wherein said capacitive means has a value less than about 100 picofarads.

8. The time measuring device according to claim 2 wherein said inductance includes an inductor wound on a ferrite core and wherein said source comprises a battery, and a Zener diode connected across said source, the voltage of said Zener diode being less than the emitter-base starting voltage of said second transistor.

9. The time measuring device according to claim 2 wherein said first and second transistors are opposite conductive types.

10. The time mesuring device according to claim 1 wherein said oscillator comprises one transistor, and said inductance includes a first winding, said first winding connected in the collector circuit of said transistor, and a second winding, said second winding connected in the base circuit of said transistor and coupled to said winding by a ferrite core.

11. The time measuring device according to claim 10 wherein said resonant circuit comprises said capacitive means and the junction capacitances of the said transistor.

12. The time measuring device according to claim 10 wherein the supply voltage for said indicating device derives from said first winding.

13. The time measuring device according to claim 1 wherein said current source includes a mercury battery providing a voltage of about 1.3 volts.

14. The time measuring device according to claim 1 wherein said indicating device comprises liquid crystals and wherein the value of said inductance and capacitive means is selected so that the overvoltage provided by said inductance supplies a feed voltage of at least 3 volts.

15. The time measuring device according to claim 1 wherein said coupling means comprises frequency divider means and decoder means, and said indicating device is formed by liquid crystals including seven segments.

16. The time measuring device according to claim 2 wherein said inductance is installed in the load circuit of said first transistor and a highly stable capacitor couples the collector of said first transistor to the base of said second transistor, the capacitance of this capacitor being low compared to the inherent capacitance of said inductance.

17. The time measuring device according to claim 16 wherein said inductance includes an inductor wound on a ferrite core.

18. The time measuring device according to claim 17 wherein said ferrite is of the type without hysteresis.

* * * * *